United States Patent [19]
Suzuki

[11] Patent Number: 5,926,334
[45] Date of Patent: Jul. 20, 1999

[54] NOISE REDUCTION SYSTEM FOR AN AUDIO SYSTEM

[75] Inventor: Shirou Suzuki, Saitama-ken, Japan

[73] Assignee: Pioneer Electronic Corporation, Tokyo, Japan

[21] Appl. No.: 08/851,278

[22] Filed: May 5, 1997

[30] Foreign Application Priority Data

May 9, 1996 [JP] Japan .................................. 8-139535

[51] Int. Cl.$^6$ ...................................................... G11B 5/02
[52] U.S. Cl. ................................ 360/55; 360/46; 360/54; 360/25
[58] Field of Search ................................. 360/55, 39, 44, 360/46, 48, 53, 54, 65, 75, 25, 66, 67

[56] References Cited

U.S. PATENT DOCUMENTS 4,599,569   7/1986   Otsuki et al. .............................. 360/65

*Primary Examiner*—Muhammad Edun
*Attorney, Agent, or Firm*—Nikaido, Marmelstein, Murray & Oram LLP

[57] ABSTRACT

An input signal from an audio system is divided into a plurality of frequency bands, and the signal in each frequency band is attenuated by an attenuator. The output signals of the attenuators are added. A level of the signal in each frequency band is detected by a level detector. A memory is provided for feeding an attenuation dependent on a level detected by the level detector. A controller is provided for controlling a signal attenuation of the attenuator by an attenuation fed from the memory in accordance with a detected level.

8 Claims, 14 Drawing Sheets

NOISE REDUCTION SYSTEM FOR AN AUDIO SYSTEM

BACKGROUND OF THE INVENTION

The present invention relates to a noise reduction system provided in a tape reproducing system.

A tape deck is provided with a noise reduction system wherein the level of sounds in middle to high frequency range where tape hiss is most objectionable, is compressed at recording and expanded at reproduction. In the typical noise reduction system such as above, since components of noise differ in accordance with the frequency range thereof, the components of the sound signal is divided into a plurality of frequency bands. A sliding band filter is provided, or the signal components are compressed and expanded so that the ratio of the noise to the signal is increased. The components are thereafter synthesized to obtain the sound signal. Another noise reproduction system uses masking effect caused by the human hearing characteristics. A low level limitter is provided to cancel noises.

In these noise reduction system, the sound signals must be controlled both at recording and at reproduction. In addition, the noise reduction cannot be carried out at the reproduction unless the signals are compressed at the recording.

SUMMARY OF THE INVENTION

An object of the present invention is to provide a noise reduction system wherein the tape noise is restrained with an operation carried out only at reproduction.

According to the present invention, there is provided a noise reduction system for an audio system comprising, dividing means for dividing an input signal from the audio system into a plurality of frequency bands, attenuators for attenuating output signals of the dividing means, respectively, adders for adding output signals of the attenuators, respectively, a level detector for detecting a level of the output signal of each of the dividing means, feeding means for feeding an attenuation dependent on a level detected by the level detector, and a controller for controlling a signal attenuation of the attenuator by an attenuation fed from feeding means in accordance with a detected level.

The present invention further provides a noise reduction system for a tape reproducing system having a tape reproducing device comprising, dividing means for dividing an input signal from the tape reproducing device into a plurality of frequency bands, attenuators for attenuating output signals of the dividing means, respectively, adders for adding output signals of the attenuators, respectively, a level detector for detecting a level of the output signal of each of the dividing means, feeding means for feeding an attenuation dependent on a level detected by the level detector, and a controller for controlling a signal attenuation of the attenuator by an attenuation fed from feeding means in accordance with a detected level, in such a manner that the signal attenuation increases as the frequency of the frequency band becomes higher.

The present invention further provides a noise reduction system for a tape reproducing system having a tape reproducing device comprising, a tape detector for identifying a tape to be reproduced, dividing means for dividing an input signal from the tape reproducing device into a plurality of frequency bands, attenuators for attenuating output signals of the dividing means, respectively, adders for adding output signals of the attenuators, respectively, a level detector for detecting a level of the output signal of each of the dividing means, feeding means for feeding an attenuation dependent on a level detected by the level detector, and a controller for controlling a signal attenuation of the attenuator by an attenuation fed from feeding means in accordance with a detected level and a result of the identification of the tape.

The present invention still further provides a noise reduction system for a tape reproducing system having a tape reproducing device comprising, noise reducing means for reducing noises in an output of the tape reproducing device, dividing means for dividing an input signal from the tape reproducing device into a plurality of frequency bands, attenuators for attenuating output signals of the dividing means, respectively, adders for adding output signals of the attenuators, respectively, a level detector for detecting a level of the output signal of each of the dividing means, feeding means for feeding an attenuation dependent on a level detected by the level detector, detector means for detecting noise reduction mode of the noise reducing means and for producing a reduction mode signal, and a controller for controlling a signal attenuation of the attenuator by an attenuation fed from feeding means in accordance with a detected level and the reduction mode signal.

In another aspect of the present invention, there is provided a noise reduction system for a tape reproducing system having a tape reproducing device comprising, dividing means for dividing an input signal from the tape reproducing device into a plurality of frequency bands, attenuators for attenuating output signals of the dividing means, respectively, adders for adding output signals of the attenuators, respectively, a level detector for detecting a level of the output signal of each of the dividing means, feeding means for feeding an attenuation dependent on a level detected by the level detector, and a controller for controlling a signal attenuation of the attenuator by an attenuation fed from feeding means in accordance with a detected level, the number of the frequency bands in a frequency range in which the frequency weighting characteristic is at a most high level is set to a larger number than other frequency ranges.

The present invention provides a noise reduction system for a tape reproducing system having a tape reproducing device comprising, dividing means for dividing an input signal from the tape reproducing device into a plurality of frequency bands, attenuators for attenuating output signals of the dividing means, respectively, adders for adding output signals of the attenuators, respectively, a level detector for detecting a level of the output signal of each of the dividing means, feeding means for feeding an attenuation dependent on a level detected by the level detector, and a controller for controlling a signal attenuation of the attenuator by an attenuation fed from feeding means in accordance with a detected level, the attenuators being provided to operate when the level of the input signal is lower than a range in which the input and output characteristic of the tape has a linearity.

The present invention further provides a noise reduction system for a tape reproducing system having a tape reproducing device comprising, dividing means for dividing an input signal from the tape reproducing device into a plurality of frequency bands, attenuators for attenuating output signals of the dividing means, respectively, adders for adding output signals of the attenuators, respectively, changing means for changing an attack time or release time of the output signal of each of the dividing means, a first level detector for detecting a level of the output signal of the changing means, feeding means for feeding an attenuation dependent on a level detected by the level detector, a second level detector for detecting a level of the output signal of each of the dividing means, a first controller for controlling a signal attenuation of the attenuator by an attenuation fed from feeding means in accordance with a detected level detected by the first level detector, and a second controller for controlling to elongate the attack time or release time as the level detected by the second level becomes lower.

The present invention still further provides a noise reduction system for a tape reproducing system having a tape reproducing device comprising, dividing means for dividing an input signal from the tape reproducing device into a plurality of frequency bands, attenuators for attenuating output signals of the dividing means, respectively, adders for adding output signals of the attenuators, respectively, changing means for changing an attack time or release time of the output signal of each of the dividing means, a level detector for detecting a level of the output signal of the changing means, feeding means for feeding an attenuation dependent on a level detected by the level detector, and a controller for controlling a signal attenuation of the attenuator by an attenuation fed from feeding means in accordance with a detected level detected by the level detector, the changing means being provided for shortening the attack time or release time as the frequency of a reproduced signal by the reproducing device becomes higher.

These and other objects and features of the present invention will become more apparent from the following detailed description with reference to the accompanying drawings.

DETAILED DESCRIPTION OF THE PREFERRED EMBODIMENTS

Figure 1:
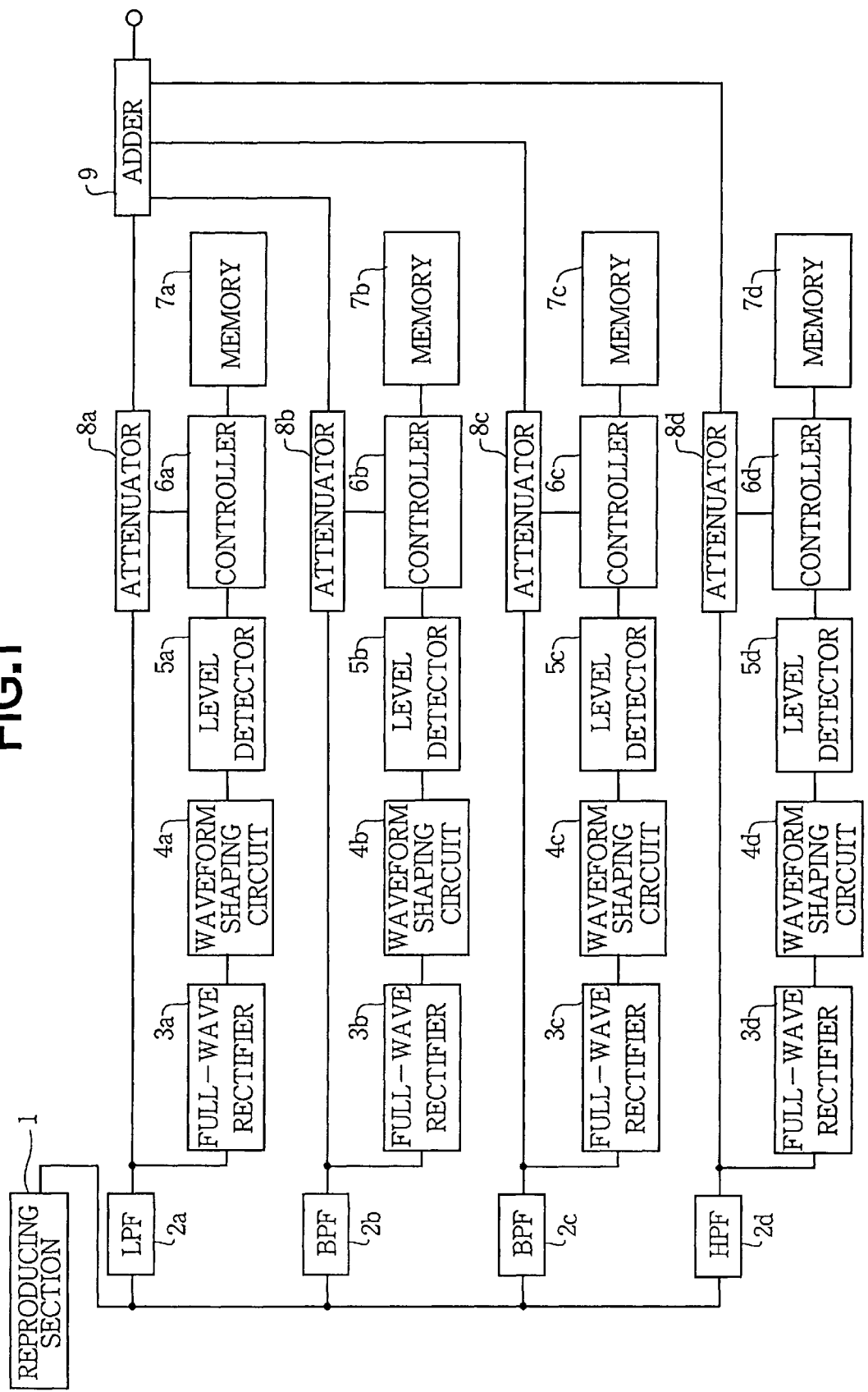
FIG. 1 is a block diagram showing a noise reduction system of the present invention.
Figure 2:
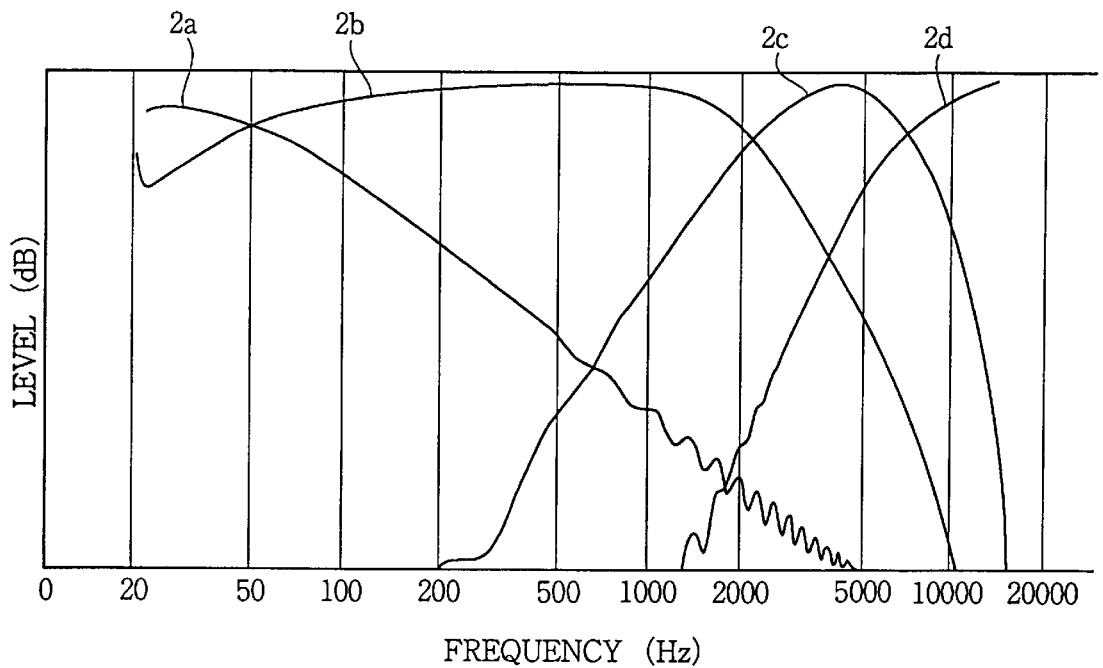
FIG. 2 is a graph showing characteristics of filters for dividing the signals in to various frequency bands.

Referring to FIG. 1, a noise reduction system according to the present invention has a reproducing section 1 having a head for reading an analog tape cassette to produce a sound signal. The reproduced sound signal is applied to a low-pass filter 2a, band-pass filters 2b and 2c, and a high-pass filter 2d so as to divide the signal into four bands in accordance with the frequency thereof. The outputs of each of the filters 2a to 2d are attenuated by respective attenuators 8a, 8b, 8c and 8d and synthesized together at an adder 9.

In order to determine the amount of attenuation at the attenuator 8, the output of the low-pass filter 2a in a form of an alternative current is applied to a full-wave rectifier 3a so as to be converted into a direct current. The direct current is applied to a waveform shaping circuit 4a which is a low-pass filter, thereby imparting the signal with a time constant for determining the attack time and the release time of the attenuation. The signal is further applied to a level detector 5a wherein a signal level of the output of the waveform shaping circuit 4a is detected. The signal level is fed to a controller 6a which retrieves an attenuation, that is attenuation amount from a memory 7a in accordance with the detected signal level. The memory 7a may store an equation depending on the determined attenuation characteristic and from which the attenuation amount is calculated, or may store a lookup table storing a plurality of attenuation amounts. The retrieved attenuation amount is fed to the attenuator 8a.

The system of the present invention is further provided with full-wave rectifiers 3b, 3c and 3d, waveform shaping circuit 4b, 4c and 4d, level detectors 5b, 5c and 5d, controllers 6b, 6c and 6d, and memories 7b, 7c and 7d for the respective frequency bands.

In operation, when the analog tape cassette is played at the reproducing section 1, the reproduced signal is divided into four bands in accordance with the low-pass filter 2a, low frequency range band-pass filter 2b, high frequency range band-pass filter 2c and the high-pass filter 2d. The output signal of the filters 2a to 2d are fed to the respective full-wave rectifiers 3a to 3d so as to be converted into direct current signals. At the waveform shaping circuits 4a to 4d, the time constants for the attack time and the release time are set so that a sudden change in the signal level is prevented. When there is a sudden change, the level detectors 5a to 5b, for example, cannot detect the signal levels, or when the signals are too quickly attenuated, the output sound of the signals synthesized at the adder 9 is suddenly decreased, thereby giving a jolt to a listener.

The signal level detectors 5a to 5d detect the level of the signals from the waveform shaping circuit 4a to 4d. Each of the controllers 6a to 6d obtains the attenuation amount based on the signal level in accordance with the attenuation characteristics set and stored in the respective memories 7a to 7d.

Figure 3:
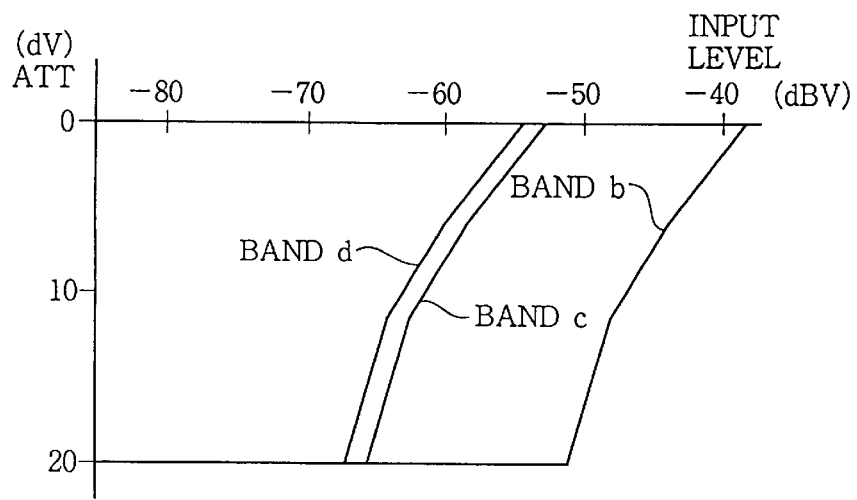
FIG. 3 is a graph showing attenuation characteristics in various frequency bands of the noise reduction system of FIG. 1.

FIG. 3 shows an example of the attenuation characteristic in each band divided by the filters 2b to 2d. A curve b shows the attenuation amount for the signals in a band b set by the band-pass filter 2b, curve c for signals in a band c set by the band-pass filter 2c, and a curve d for signals in a band d set by the high-pass filter 2d. In the present example, the signals passing through the low-pass filter 2a are not attenuated. The reason for not attenuating in the band range is that, in view of the fact that the human ear is relatively insensitive to the sound in the low-frequency range, the system can be simplified. Of course, the signals in the low frequency range can be attenuated to reduce the noises to obtain an improved sound reproduction.

Figure 4:
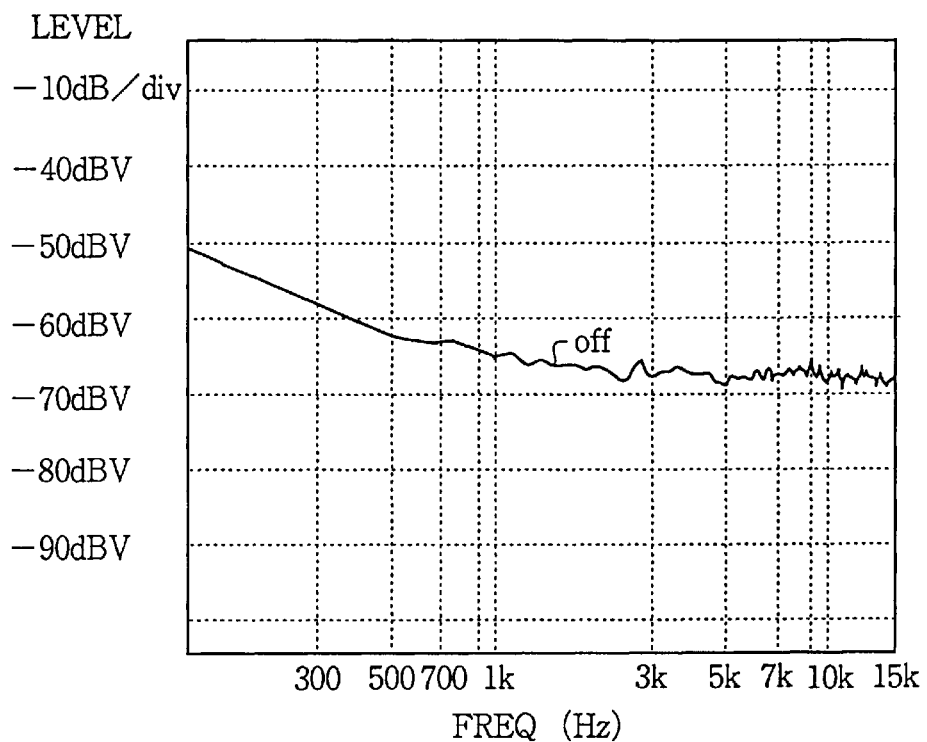
FIG. 4 is a graph showing untreated noise level in an ordinary analog tape reproducing system.

As shown in FIG. 3, the attenuating characteristic in each band is set to compress the signals near the hiss noise level shown in FIG. 4. A line marked off shows the hiss noise level of an analog tape cassette depending on frequency. As shown in FIG. 4, the hiss noise level in a high frequency range is lower than in a lower frequency range. Namely, the signals in the range near the hiss noise level is deemed to consist mainly of noises and no sound signal, and hence attenuated.

Therefore, as the frequency increases from the bands b, c to d, the signal level at which the attenuation is started is set smaller as shown in FIG. 3. If the attenuation characteristics of the all of the bands are set the same, even the sound signals may be compressed, or the noise may be kept without being compressed in the band where the set attenuation characteristic is deflected from the actual hiss noise level.

The attenuation amounts in each band are set to gradually increase as the signal level decreases. For example, in a signal in the band d where the signal level is gradually decreased, at the time when the level reaches −66 dBV, which is the hiss noise level in the band d, if the signal is rapidly attenuated by 20 dBV, the level of the output signal of the attenuator 8d is suddenly decreased so that the listener feels a jolt. In order to prevent such a disturbance, the attenuation amount is set to gradually increase as the signal level is decreased.

The attenuation amount thus obtained is fed from the controller 6a to 6d to the respective attenuators 8a to 8d to which each output of the filters 2a to 2d are applied. Hence signals passing each of the filters 2a to 2d are appropriately attenuated. The attenuated signals are added at the adder 9, the output signal of which has reduced noises.

As shown by the attenuation characteristics shown in FIG. 3, the attenuation amount in the present example is set to increase at a smaller increment as the input signal level decreases. Such a characteristics can be arbitrarily modified, and for example, be expressed by linear equations.

In the case of a CD player, the same attenuation characteristics may be applied in all frequency bands.

Figure 5:
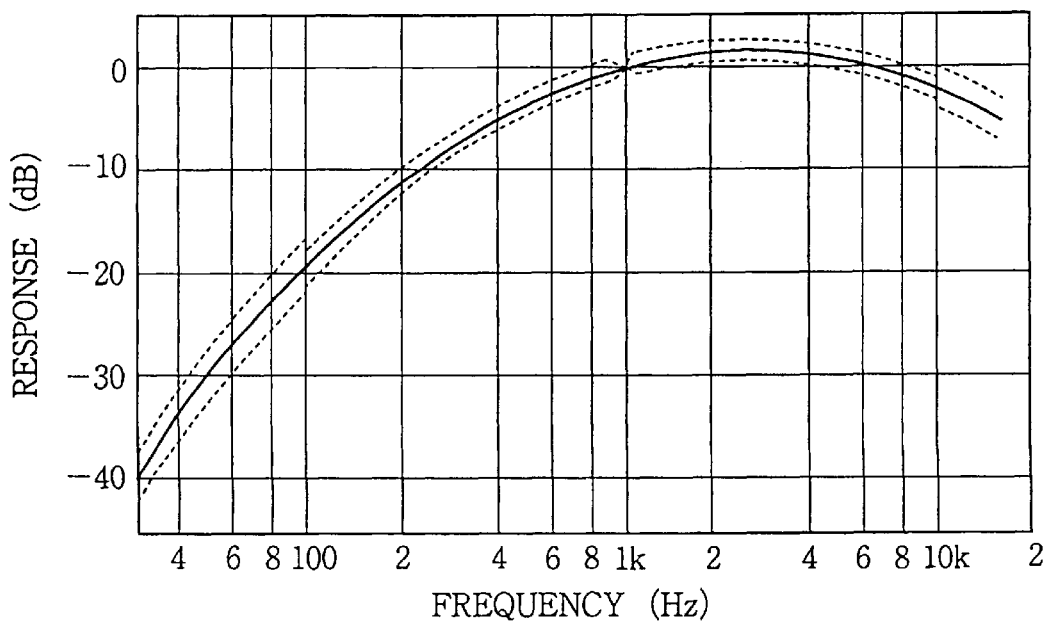
FIG. 5 is a graph showing frequency weighting characteristics for auditory sensation.
Figure 6:
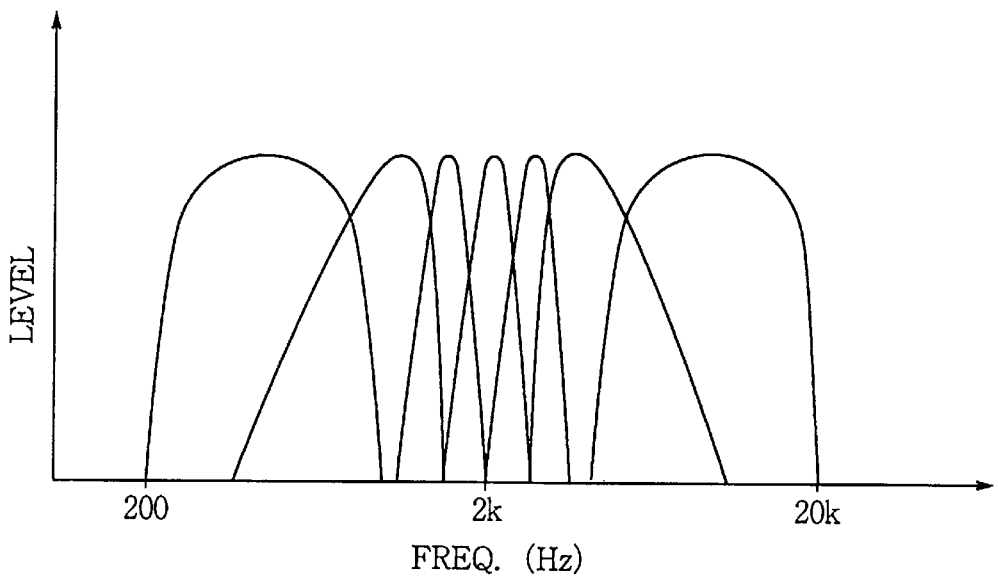
FIG. 6 is a graph showing characteristics of various filters provided in a modification of the noise reduction system of FIG. 1.

The noise reduction system of FIG. 1 may be further modified to increase the number of filters. Although the increase of filters renders it possible to accurately divide the noises from sound signal, it also increases the manufacturing cost and complicates the system. Based on the frequency weighting characteristics for auditory sensation shown in FIG. 5, the number of filters is increased in a range adjacent 2 KHz where the ear is most sensitive as shown in FIG. 6. Although the devices for obtaining the attenuation down stream of the filters are increased, the noises detected by the auditory sensation can be effectively restrained with a smaller number of devices than when the frequency range are equally divided.

Figure 7:
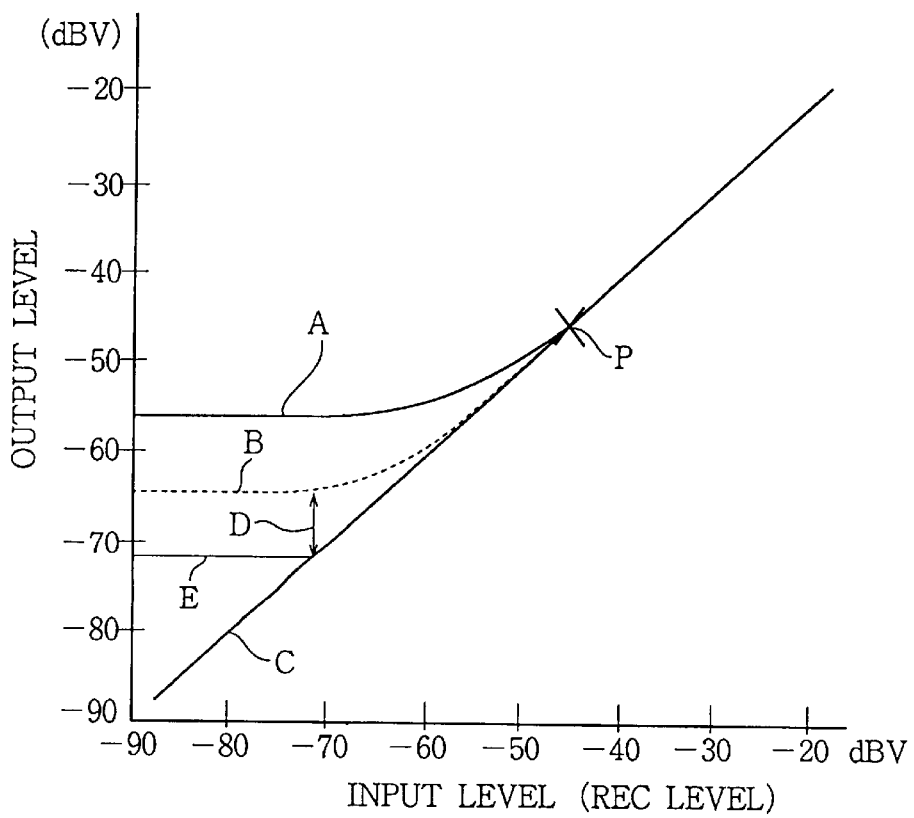
FIG. 7 is a graph showing a relationship between input and output levels of signals.

In a sound reproducing system, it goes without saying that maintaining the linearity between the input and the output levels is extremely important. A line C in FIG. 7 shows an ideal linear characteristic between the input and output signals. However, such a linearity cannot always be obtained. For example, depending on a hiss noise level of a tape cassette, since the output signal consists mostly of noises at a low input signal level, the dynamic range cannot be maintained.

The compression of signals also causes deterioration in linearity. In the first embodiment, the compression is set to start at a level higher than the hiss noise level by 14 dB and the linearity deteriorates as soon as the compression is started. In the present modification, the compression is started at a level when the linearity starts to deteriorate or when the dynamic range cannot be obtained so that the noise reduction can be carried out without loosing linearity.

In a conventional noise reduction system, the compression and expanding of signals is performed where the linearity is maintained.

Referring to FIG. 7, a solid line A shows the characteristic between input and output levels when the signal does not pass through a filter, and a dashed line B shows the characteristic when the signal passes through a predetermined filter. Although the line B runs close to the ideal line C than the line A, both lines A and B deflect from the line C starting at a point P, the input level of which is −45 dBV. When the input level lower than about −75 dBV, since the signals are mostly noises, the output level becomes substantially constant.

In order to approximate the input and output characteristic shown by the line B to the ideal characteristic shown by the line C, the attenuation characteristic is so set that a difference between the output levels of the lines B and C is attenuated. Since the noise reduction system of the present invention is operated only at the reproduction, the recorded tape does not store any information on input level. Thus the attenuation amount is determined based on the output level.

Figure 8:
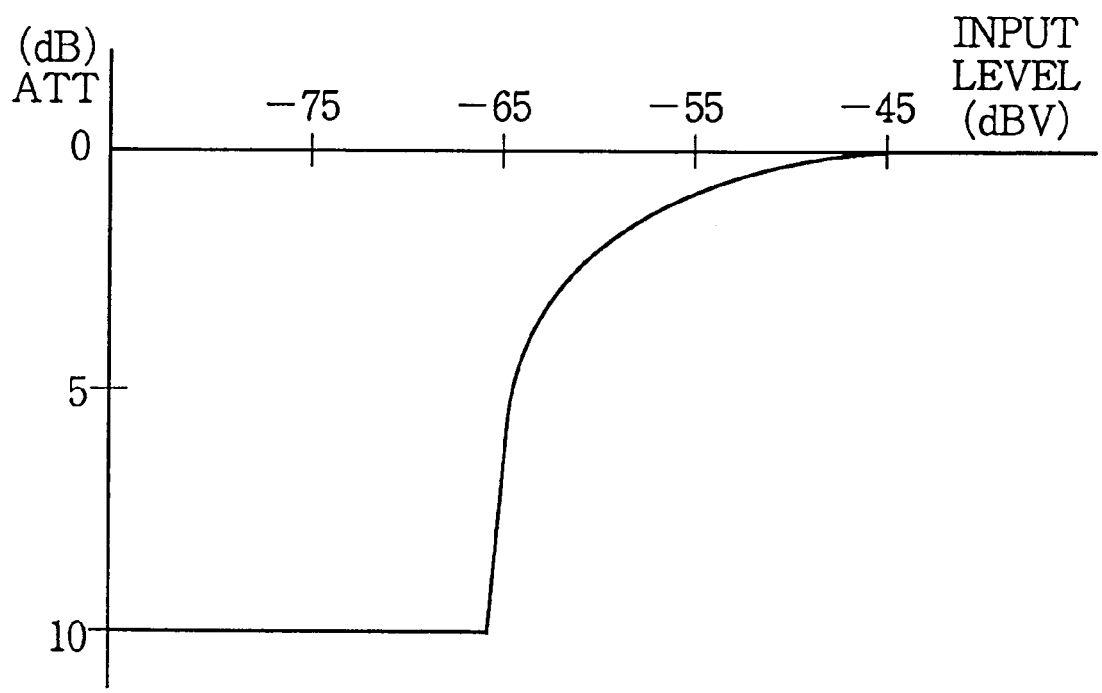
FIG. 8 is a graph showing attenuation characteristic in a modification of the system of FIG. 1.

More particularly, in a range between the levels −45 dBV and −75 dBV, the output level differs from the input level so that the difference between the levels of the lines B and C can be estimated. However, in a range lower than the level −75 dBV, the output level becomes substantially constant so that the difference cannot be estimated. Hence in a signal, the level of which is gradually declined, when the output level becomes −65 dBV, the attenuation amount is set to correspond to a difference D which is a difference between the input level and the output level at −72 dBV. FIG. 8 shows the attenuation amount thus obtained. As a result, the output level becomes constant in the range lower than −72 dBV as shown by a line E in FIG. 7.

Figure 9:
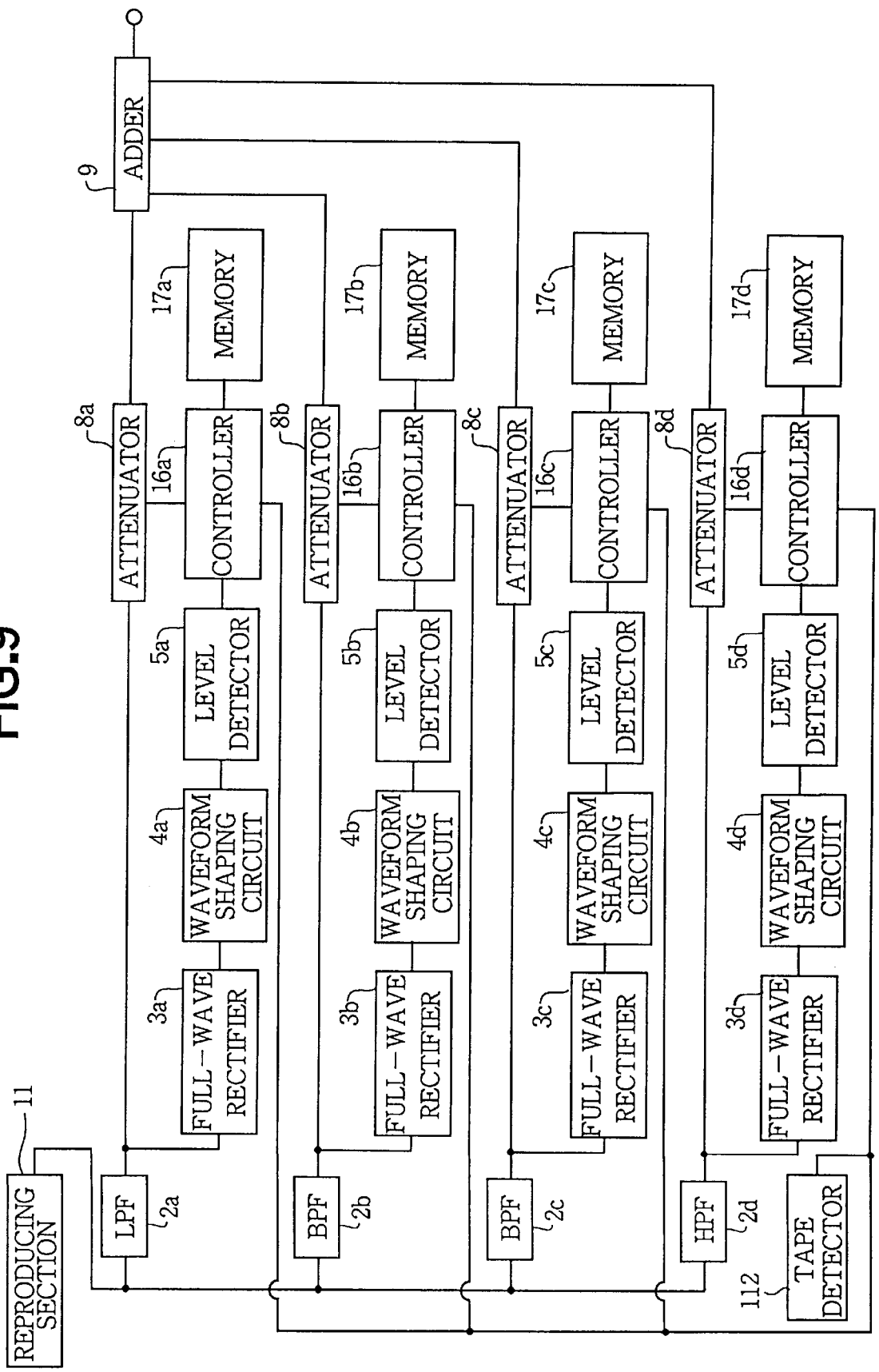
FIG. 9 is a block diagram of a noise reduction system of a second embodiment of the present invention.
Figure 10:
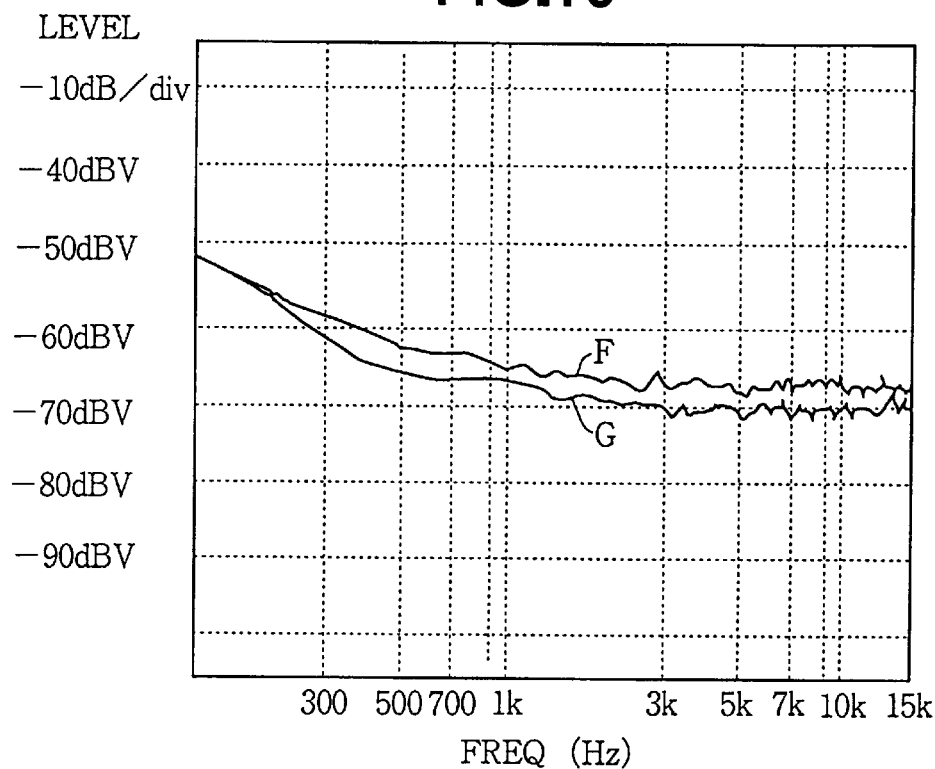
FIG. 10 is a graph showing noise levels in accordance with the type of of tape used.

FIG. 9 shows a second embodiment of the present invention where attenuation characteristic differs depending on the type of tape used. As shown in FIG. 10, hiss noise level of a normal tape, indicated F, differs from hiss noise level of chromium dioxide or metal tape, indicated G. Namely, in a frequency range higher than 300 Hz, the noise level of the chromium dioxide/metal tape (G) is lower than that of the normal tape (F).

Referring to FIG. 9, the noise reduction system of the present embodiment has a reproducing section 11 which reproduces a sound signal from an analog tape. The signal is divided into four frequency bands by the filters 2a to 2d as described in the first embodiment. The signals in the respective bands are processed by the full-wave rectifiers 3a to 3d, waveform shaping circuits 4a to 4d and level detectors 5a to 5d. The detected levels are fed to the respective controllers 16a, 16b, 16c and 16d.

The system is further provided with a tape detector 112 which mechanically detects a window provided in the tape cassette indicating the type of the tape and generates a corresponding signal to the controllers 16a to 16d. Each of the controllers 16a to 16d looks up corresponding memories 17a, 17b, 17c and 17d to obtain the attenuation amount in accordance with the input level and the type of the tape.

Figure 11:
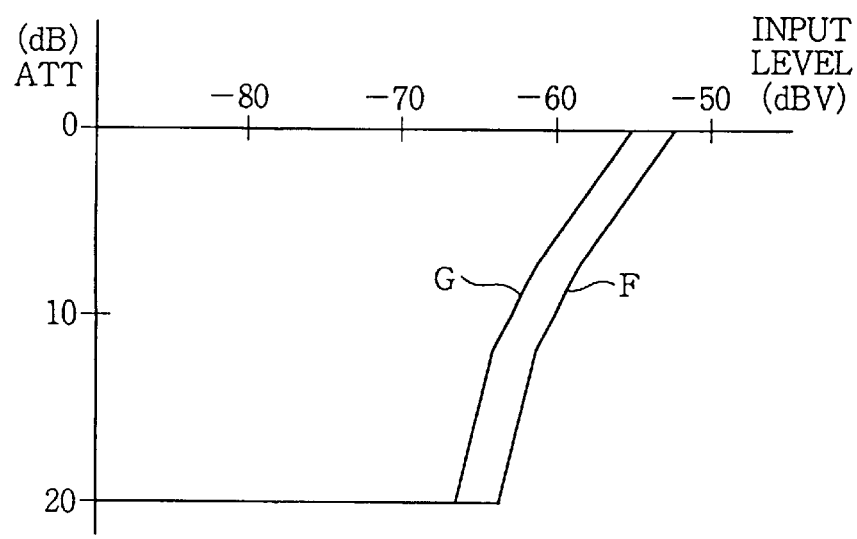
FIG. 11 is a graph showing an example of attenuation characteristic in the system of FIG. 9.

More particularly, there are provided in each memory, two attenuation characteristics shown by curves F and G in FIG. 11, each for the normal tape and the chromium dioxide/metal tape. FIG. 11 shows the attenuation characteristics in the frequency band c which is stored in the memory 17c. In the case of the normal tape shown by the curve F, when the input level is higher than −52 dBV, the signal is not attenuated. The attenuation is started when the level is further decreased. The attenuation amount is increased so that at an input level of −58 dBV, the attenuation becomes 6 dB. Hence the output level of the attenuator 8c becomes −64 dBV. By thus providing attenuation characteristic for each type of tape, an appropriate sound reduction is carried out.

Figure 12:
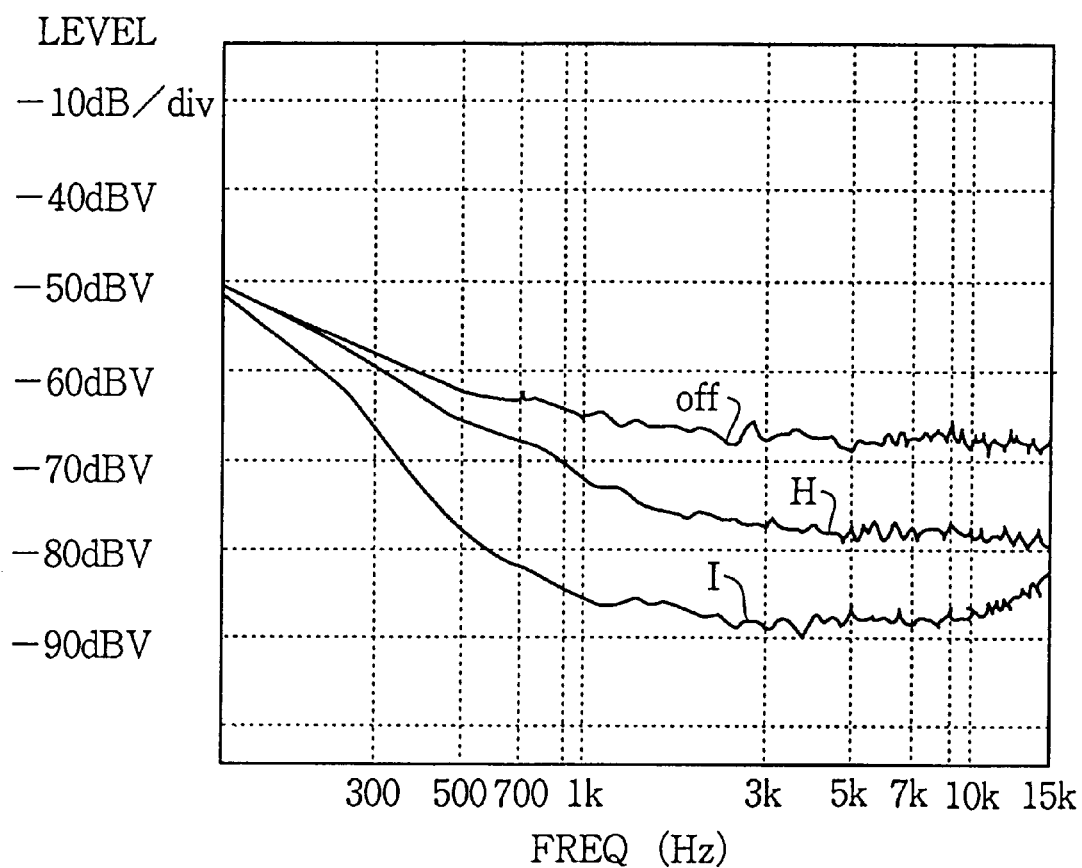
FIG. 12 is a graph showing untreated noise level and reduced noise levels in a conventional noise reduction systems.

There is known a conventional noise reduction system such as Dolby B and Dolby C systems. ("Dolby" is a registered trademark of Dolby Laboratories.) When the noise reduction system of the present invention is used together with these conventional systems, noise levels after the noise reduction differ depending on the system used. FIG. 12 shows noise levels of a signal H after the treatment by Dolby B system, a signal I after treatment by Dolby C system, and the noise level off of the untreated signal. When the first embodiment of the present invention is used with the Dolby B system, a sound signal in a range higher than the hiss noise level J is attenuated, since the signal is in a range under the hiss noise level off.

The third embodiment of the present invention aims to prevent such a problem, and is adapted to operate the attenuation in accordance with attenuation characteristic appropriate for each circumstance.

Figure 13:
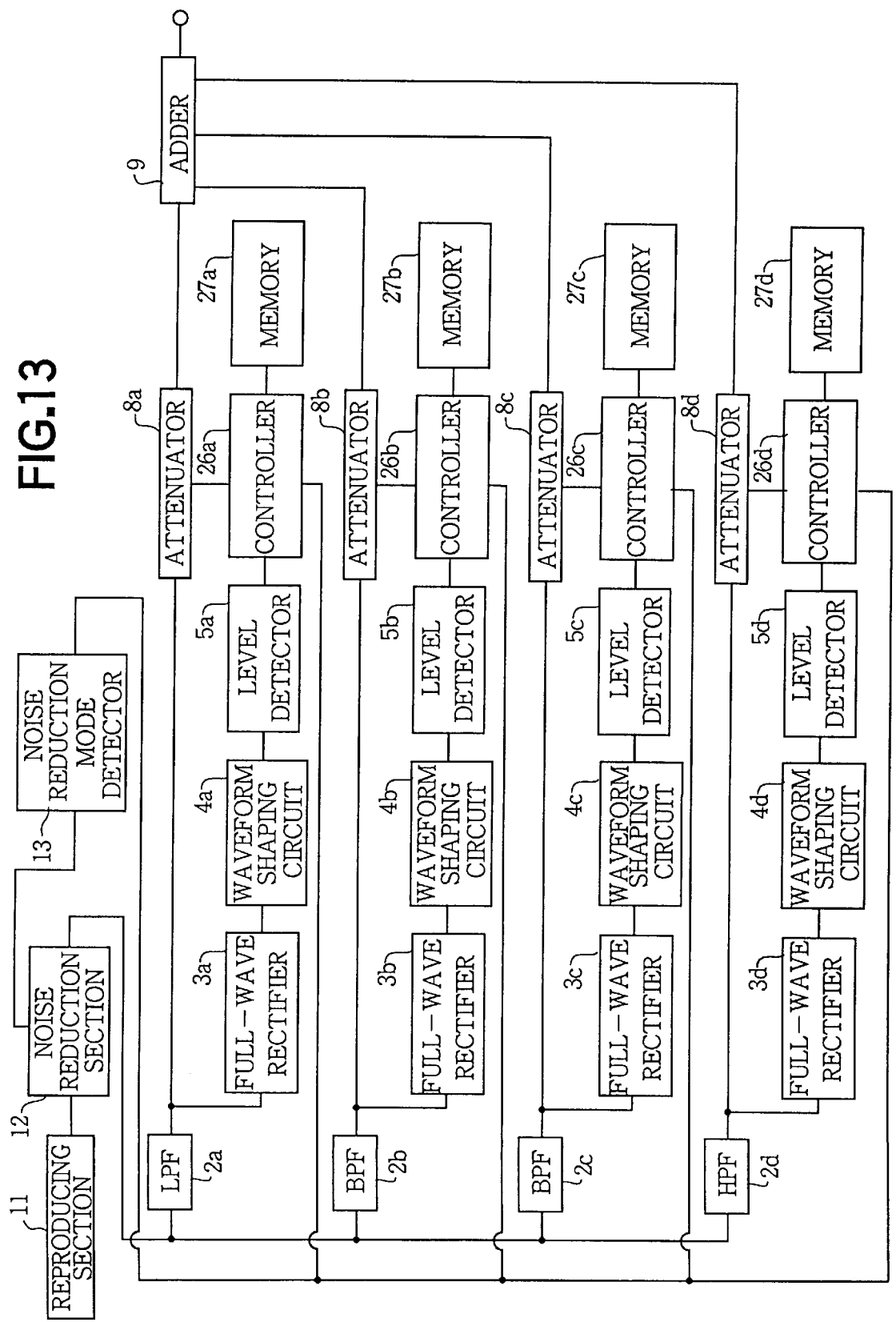
FIG. 13 is a block diagram of a noise reduction system of a third embodiment of the present invention.

Referring to FIG. 13, the reproduced sound signal from the reproducing section 11 is applied to a noise reduction section 12 where the noise reduction is carried out in accordance with the conventional system such as the Dolby B and the Dolby C systems. The treated signal is divided into four frequency bands by the filters 2a to 2d as described in the first embodiment. The signals in the respective bands are processed by the full-wave rectifiers 3a to 3d, waveform shaping circuits 4a to 4d and level detectors 5a to 5d. The detected levels are fed to the respective controllers 26a, 26b, 26c and 26d.

The system is further provided with a noise reduction mode detector 13 to which the output signal of the noise reduction section 12 is fed to detect the mode in which the noise reduction is carried out. A detection signal from the mode detector 13 is applied to each of the controllers 26a to 26d, which looks up corresponding memories 27a, 27b, 27c and 27d. Each memory stores attenuation amounts in accordance with the attenuation characteristics for untreated signal, signal treated by the Dolby B system, and signal treated by the Dolby C system.

Figure 14:
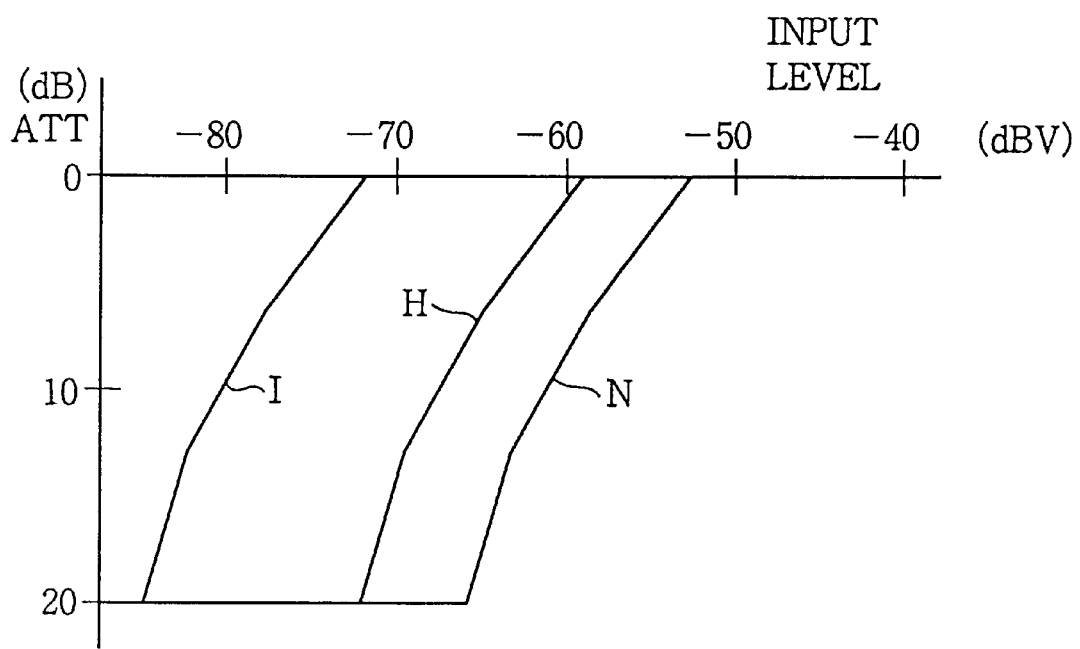
FIG. 14 is a graph showing an example of attenuation characteristics in the system of FIG. 13.

FIG. 14 shows the attenuation characteristics in the band c. As shown in the figure, the attenuation amount for the Dolby C signal I is set smaller than that for the Dolby B signal H, and the Dolby B signal H further smaller than the amount for the untreated signal marked N.

In operation, when noise reduction is performed at the noise reduction section 12 in the Dolby B mode, the noise in the reproduced signal from the reproduction section 11 is reduced. The reproduced signal is applied to filters 2a to 2d and the output signal thereof are processed at the respective full-wave rectifiers 3a to 3d, and the waveform shaping circuits 4a to 4d, and the signal levels thereof are detected at the level detectors 5a to 5b.

The noise reduction mode detector 13 detects that Dolby B mode is employed in the noise reduction section 12. The controllers 26a to 26d when fed from the output signal of the mode detector 13, retrieves attenuation amounts based on the signal level and the Dolby B noise reduction mode.

The attenuation amount thus obtained is fed from the controller 26a to 26d to the respective attenuators 8a to 8d. The reproduced signals from the filters 2a to 2d applied to the attenuators 8a to 8d are hence attenuated. The attenuated signals are added at the adder 9, the output signal of which has reduced noises.

In a reproducing system provided with only the Dolby B system, it suffices to store in the memories 27a to 27d, only the attenuation characteristics for the Dolby B signal and untreated signal.

In a low input level range wherein attenuation is carried out, when the signal is attenuated too rapidly, the sound is suddenly decreased. On the other hand, when a high level signal is input, if the attenuation is carried out over a long period, there is generated a large difference between the original signal and the attenuated signal. The fourth embodiment of the present invention, which is described hereinafter with reference to FIGS. 15 to 17, solves such a problem.

Figure 15:
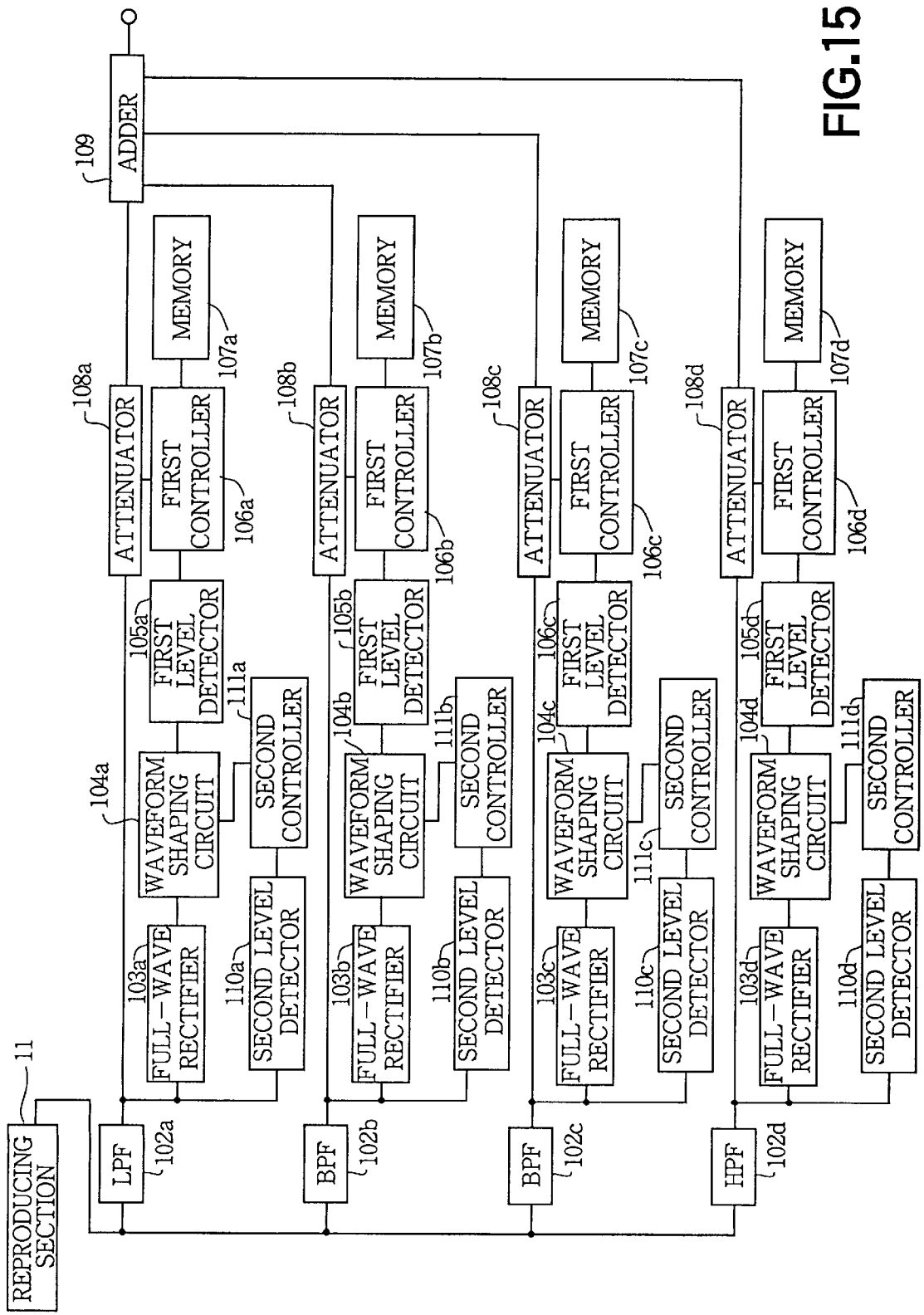
FIG. 15 is a block diagram of a noise reduction system of a fourth embodiment of the present invention.

Referring to FIG. 15, the sound signal reproduced at the reproducing section 11 is applied to a low-pass filter 102a, band-pass filters 102b and 102c, and a high-pass filter 102d so as to divide the signal into four bands. The outputs of each of the filters 102a to 102d are attenuated by respective attenuators 108a, 108b, 108c and 108d and synthesized together at an adder 109.

The output signals of the filters 102a to 102d are fed to respective waveform shaping circuits 104a to 104d through full-wave rectifiers 103a to 103d. The levels of the output signals of the waveform shaping circuits are detected by first level detectors 105a to 105d. The detected levels are applied to first controllers 106a to 106d, each of which derives an attenuation amount from respective memories 107a to 107d in accordance with the detected level.

The output signals of filters 102a to 102d are further fed to second signal detectors 110a to 110d wherein the levels of the signals are detected. The signal levels are applied to second controllers 111a to 111d, each of which applies a control signal to the waveform shaping circuits 104a to 104d to control the attack and release time of the attenuation.

Figure 16:
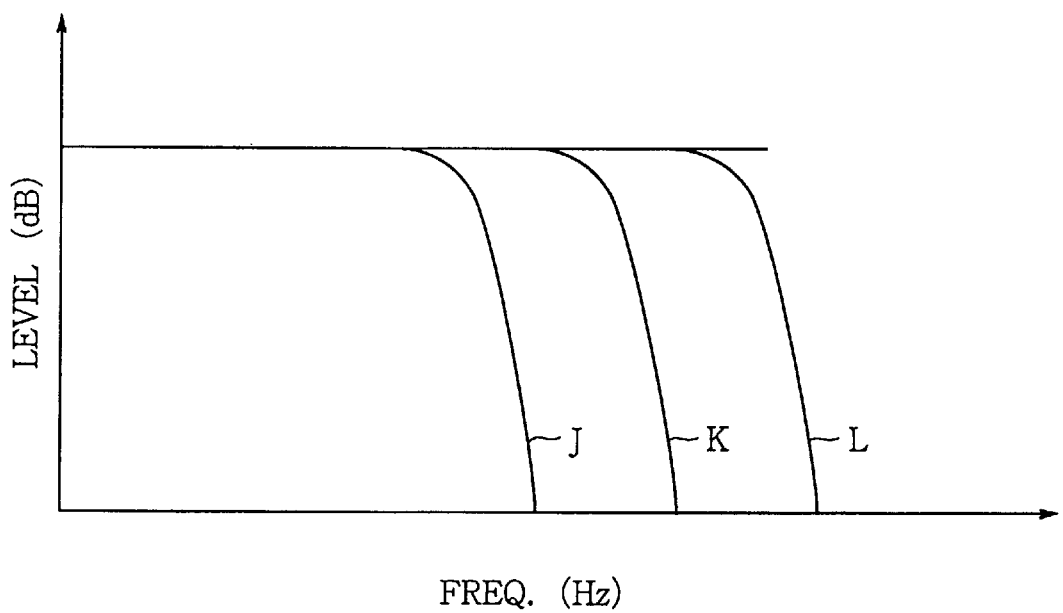
FIG. 16 is graph showing the characteristics of waveform shaping circuits provided in the noise reduction system of FIG. 15.
Figure 17:
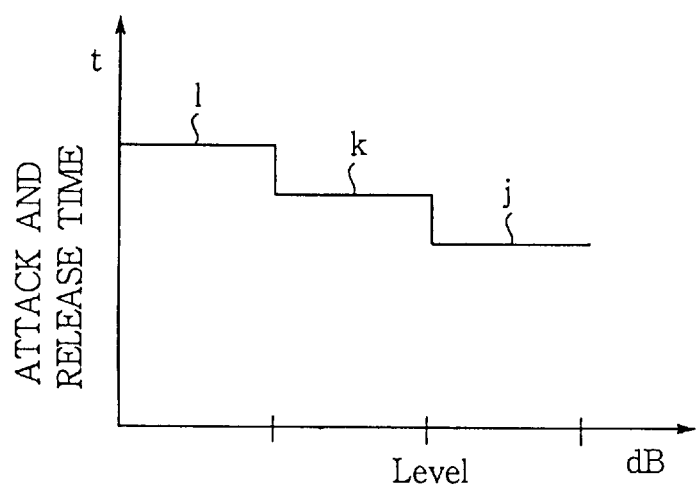
FIG. 17 is a graph showing attack and release times set in the noise reduction system of FIG. 15.
Figure 18:
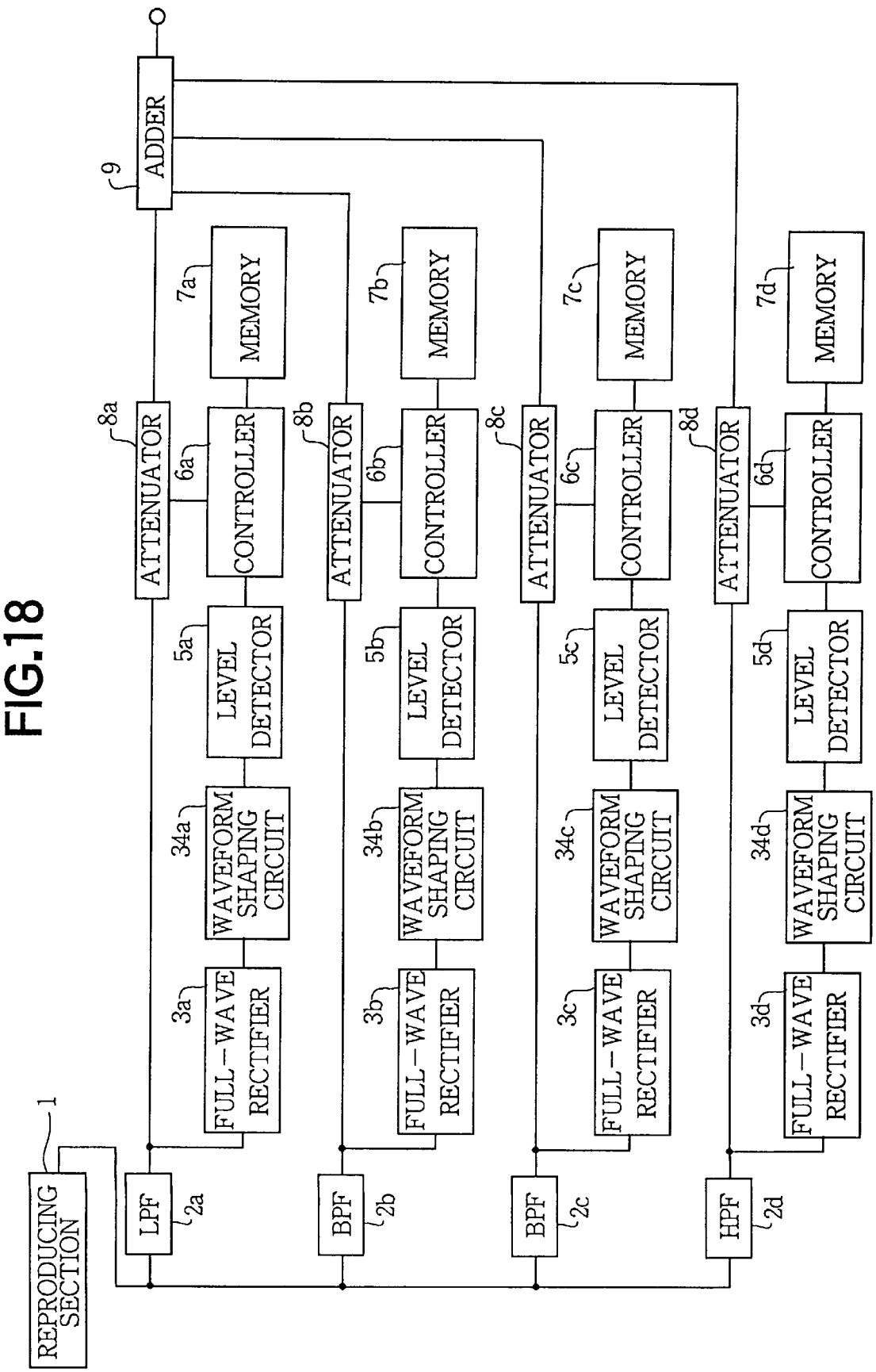
FIG. 18 is a block diagram of a noise reduction system of a fifth embodiment of the present invention.

More particularly, as shown in FIG. 16, when the input signal level detected by the second level detectors 110a to 110d is high, the characteristic of the low-pass filters in the waveform shaping circuits 104a to 104d are set to a curve J. Accordingly, the attack and release times of the attenuations are set to a short period j as shown in FIG. 17. Hence a quick response is obtained.

On the other hand, when the detected level is low, the characteristics of the waveform shaping circuits 104a to 104d are set to correspond to a curve L. Thus a long attack and release time l shown in FIG. 17 is set.

The attenuation amount obtained at the controllers 108a to 108d are applied to the attenuators 108a to 108d so that the reproduced signals from the filters 102a to 102d are attenuated in accordance with each attenuation amount at timings determined by the waveform shaping circuits 104a to 104b.

There may be a case where the level of the reproduced signal is suddenly decreased, for example in a band b shown in FIG. 3, from a level where the attenuation amount is zero to a level about −70 dBV where the attenuation amount is maximum. If the attenuation is carried out accordingly, there occurs an abrupt change which is unpleasant to the ear. In the present embodiment, when the second level detector 110b detects that the signal in the band b is at the level −70 dBV, the detected level is applied to the second controller 111b which then selects a long attack and release time l shown in FIG. 17. Hence the reproduced signal is gradually attenuated, thereby preventing an abrupt decrease in the sound level.

Figure 19:
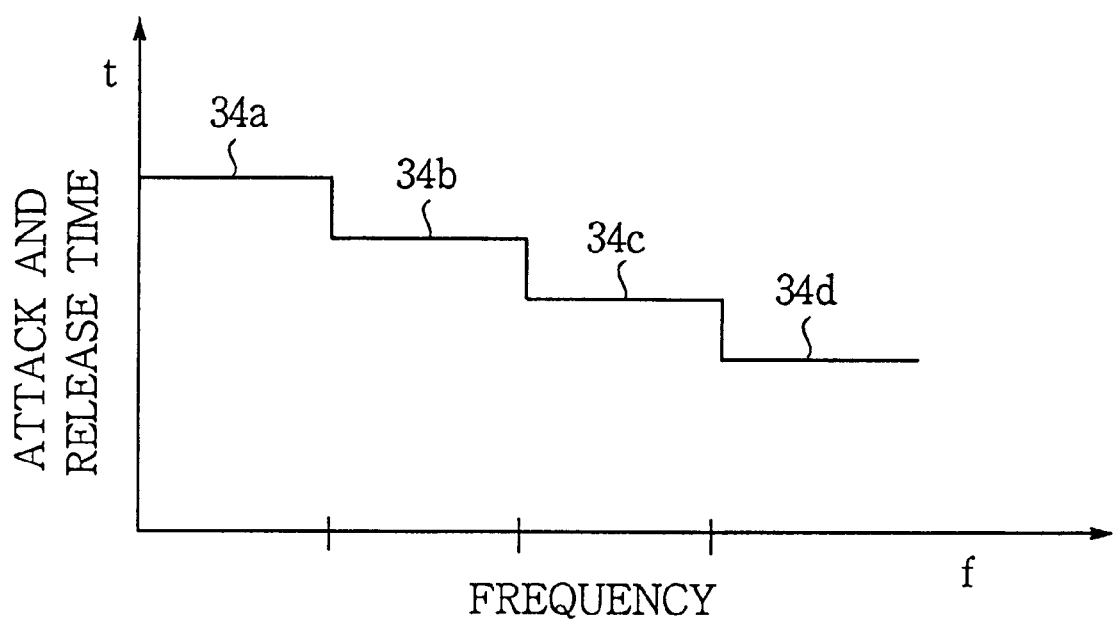
FIG. 19 is a graph showing attack and release times set in the noise reduction system of FIG. 18.

Referring to FIG. 19, the noise reduction system of the fifth embodiment of the present invention has the same construction as that of the first embodiment shown in FIG. 1 except for the waveform shaping circuits. In the fifth embodiment, there are provided waveform shaping circuits 34a, 34b, 34c and 34d, the characteristics of which differ from those of one another. Namely, the cutoff frequency of the waveform shaping circuit 34a for the low frequency range is set at the lowest. The cutoff frequency is raised as the frequencies of the signals increase, and becomes maximum in the waveform shaping circuit 34d for the high frequency range. Accordingly, the attack and release time is set by each of the waveform shaping circuits 34a to 34d as shown in FIG. 19.

More particularly, in the case of music signals. the signal level is apt to change rather slowly in a low frequency range and rather quickly in a high frequency range. If the attack and release time is set the same in all frequency ranges, the attack and release time becomes too long to cope with the change in signal level in the high frequency range. Hence the reproduced music may sound strange. In the present embodiment, since the attack and release time is set short in the waveform shaping circuit 34d in the high frequency range, the sound level can be smoothly changed.

From the foregoing it will be understood that the present invention provides a noise reduction system wherein the noise reduction operation is carried out only at the reproduction based on the noise included in the reproduced sound. Thus the system can be extensively applied to audio devices.

While the invention has been described in conjunction with preferred specific embodiment thereof, it will be understood that this description is intended to illustrate and not limit the scope of the invention, which is defined by the following claims.

What is claimed is:

1. A noise reduction system for an audio system comprising:
    dividing means for dividing an input signal from the audio system into a plurality of frequency bands;
    attenuators for attenuating output signals of the dividing means, respectively;
    adders for adding output signals of the attenuators, respectively;
    a level detector for detecting a level of the output signal of each of the dividing means;
    feeding means for feeding an attenuation dependent on a level detected by the level detector; and
    a controller for controlling a signal attenuation of the attenuator by an attenuation fed from feeding means in accordance with a detected level.

2. A noise reduction system for a tape reproducing system having a tape reproducing device comprising:
    dividing means for dividing an input signal from the tape reproducing device into a plurality of frequency bands;
    attenuators for attenuating output signals of the dividing means, respectively;
    adders for adding output signals of the attenuators, respectively;
    a level detector for detecting a level of the output signal of each of the dividing means;
    feeding means for feeding an attenuation dependent on a level detected by the level detector; and
    a controller for controlling a signal attenuation of the attenuator by an attenuation fed from feeding means in accordance with a detected level, in such a manner that the signal attenuation increases as the frequency of the frequency band becomes higher.

3. A noise reduction system for a tape reproducing system having a tape reproducing device comprising:
    a tape detector for identifying a tape to be reproduced;
    dividing means for dividing an input signal from the tape reproducing device into a plurality of frequency bands;
    attenuators for attenuating output signals of the dividing means, respectively;
    adders for adding output signals of the attenuators, respectively;
    a level detector for detecting a level of the output signal of each of the dividing means;
    feeding means for feeding an attenuation dependent on a level detected by the level detector; and
    a controller for controlling a signal attenuation of the attenuator by an attenuation fed from feeding means in accordance with a detected level and a result of the identification of the tape.

4. A noise reduction system for a tape reproducing system having a tape reproducing device comprising:
    noise reducing means for reducing noises in an output of the tape reproducing device;
    dividing means for dividing an input signal from the tape reproducing device into a plurality of frequency bands;
    attenuators for attenuating output signals of the dividing means, respectively;
    adders for adding output signals of the attenuators, respectively;
    a level detector for detecting a level of the output signal of each of the dividing means;
    feeding means for feeding an attenuation dependent on a level detected by the level detector;
    detector means for detecting noise reduction mode of the noise reducing means and for producing a reduction mode signal; and
    a controller for controlling a signal attenuation of the attenuator by an attenuation fed from feeding means in accordance with a detected level and the reduction mode signal.

5. A noise reduction system for a tape reproducing system having a tape reproducing device comprising:
    dividing means for dividing an input signal from the tape reproducing device into a plurality of frequency bands;
    attenuators for attenuating output signals of the dividing means, respectively;
    adders for adding output signals of the attenuators, respectively;
    a level detector for detecting a level of the output signal of each of the dividing means;

feeding means for feeding an attenuation dependent on a level detected by the level detector; and a controller for controlling a signal attenuation of the attenuator by an attenuation fed from feeding means in accordance with a detected level;

the number of the frequency bands in a frequency range in which the frequency weighting characteristic is at a most high level is set to a larger number than other frequency ranges.

6. A noise reduction system for a tape reproducing system having a tape reproducing device comprising:

dividing means for dividing an input signal from the tape reproducing device into a plurality of frequency bands;

attenuators for attenuating output signals of the dividing means, respectively;

adders for adding output signals of the attenuators, respectively;

a level detector for detecting a level of the output signal of each of the dividing means;

feeding means for feeding an attenuation dependent on a level detected by the level detector; and a controller for controlling a signal attenuation of the attenuator by an attenuation fed from feeding means in accordance with a detected level;

the attenuators being provided to operate when the level of the input signal is lower than a range in which the input and output characteristic of the tape has a linearity.

7. A noise reduction system for a tape reproducing system having a tape reproducing device comprising:

dividing means for dividing an input signal from the tape reproducing device into a plurality of frequency bands;

attenuators for attenuating output signals of the dividing means, respectively;

adders for adding output signals of the attenuators, respectively;

changing means for changing an attack time or release time of the output signal of each of the dividing means;

a first level detector for detecting a level of the output signal of the changing means;

feeding means for feeding an attenuation dependent on a level detected by the level detector;

a second level detector for detecting a level of the output signal of each of the dividing means;

a first controller for controlling a signal attenuation of the attenuator by an attenuation fed from feeding means in accordance with a detected level detected by the first level detector; and a second controller for controlling to elongate the attack time or release time as the level detected by the second level becomes lower.

8. A noise reduction system for a tape reproducing system having a tape reproducing device comprising:

dividing means for dividing an input signal from the tape reproducing device into a plurality of frequency bands;

attenuators for attenuating output signals of the dividing means, respectively;

adders for adding output signals of the attenuators, respectively;

changing means for changing an attack time or release time of the output signal of each of the dividing means;

a level detector for detecting a level of the output signal of the changing means;

feeding means for feeding an attenuation dependent on a level detected by the level detector; and a controller for controlling a signal attenuation of the attenuator by an attenuation fed from feeding means in accordance with a detected level detected by the level detector;

the changing means being provided for shortening the attack time or release time as the frequency of a reproduced signal by the reproducing device becomes higher.

* * * * *